US006409839B1

(12) United States Patent
Sun et al.

(10) Patent No.: US 6,409,839 B1
(45) Date of Patent: Jun. 25, 2002

(54) METHOD AND APPARATUS FOR VAPOR GENERATION AND FILM DEPOSITION

(75) Inventors: James J. Sun, New Brighton; Benjamin Y. H. Liu, North Oaks, both of MN (US)

(73) Assignee: MSP Corporation, Minneapolis, MN (US)

( * ) Notice: Subject to any disclaimer, the term of this patent is extended or adjusted under 35 U.S.C. 154(b) by 0 days.

(21) Appl. No.: 09/435,515

(22) Filed: Nov. 8, 1999

Related U.S. Application Data

(63) Continuation-in-part of application No. 08/898,662, filed on Jul. 22, 1997, now abandoned, which is a continuation of application No. 08/867,340, filed on Jun. 2, 1997, now abandoned, and a continuation-in-part of application No. PCT/US98/11090, filed on Jun. 1, 1998.

(51) Int. Cl.[7] .............................. C23C 16/00

(52) U.S. Cl. .................. 118/726; 261/141; 261/142; 261/115; 392/396; 392/397

(58) Field of Search .................. 118/726, 723 VE, 118/723 EB; 392/386, 389, 388; 261/142

(56) References Cited

U.S. PATENT DOCUMENTS

| | | | | | |
|---|---|---|---|---|---|
| 4,332,838 | A | * | 6/1982 | Wegrzyn | 427/74 |
| 4,970,093 | A | | 11/1990 | Sievers et al. | |
| 5,110,618 | A | * | 5/1992 | Faust | 427/482 |
| 5,266,355 | A | * | 11/1993 | Wernberg et al. | 427/248.1 |
| 5,271,957 | A | * | 12/1993 | Wernberg et al. | 427/109 |
| 5,278,138 | A | * | 1/1994 | Ott et al. | 427/255.1 |
| 5,361,800 | A | | 11/1994 | Ewing | |
| 5,371,828 | A | | 12/1994 | Ewing | |
| 5,536,323 | A | | 7/1996 | Kirlin et al. | |
| 5,540,959 | A | * | 7/1996 | Wang | 427/248.1 |
| 5,547,708 | A | | 8/1996 | Asaba et al. | |
| 5,835,677 | A | * | 11/1998 | Li et al. | 392/401 |
| 6,036,783 | A | * | 3/2000 | Fukunaga et al. | 118/724 |
| 6,244,575 | B1 | * | 6/2001 | Vaartstra et al. | 261/141 |

FOREIGN PATENT DOCUMENTS

| | | |
|---|---|---|
| EP | 0 058 571 | 8/1982 |
| EP | 0 548 926 | 6/1993 |
| EP | 0 548 990 | 6/1993 |
| FR | 2 707 671 | 1/1995 |

OTHER PUBLICATIONS

"Aerosol–Assisted Chemical Vapor Deposition of CE02–DOPED Y203–Stabilized ZR03 Films on Porous Ceramic Supports for Membrane Applications", C. Xia et al.; Chemical Vapor Deposition, vol. 2 (1996) pp. 31, 32, 48–51.

"Metalorganic Chemical Vapor Deposition Using a Single Solution Source for High JCY1BA2CU307–X Superconducting Films", S. Matsuno et al.; Applied Physics Letters, vol. 60, No. 19, May 11, 1992. pp. 2427–2429.

"Flexible System for Controlled Chemical Delivery of Vapors", IBM Technical Disclosure Bulletin, vol. 33, No. 3B, Aug. 1990, pp. 341–342.

* cited by examiner

*Primary Examiner*—Gregory Mills
*Assistant Examiner*—Sylvia R MacArthur
(74) *Attorney, Agent, or Firm*—Nickolas E. Westman; Westman, Champlin & Kelly

(57) ABSTRACT

A vapor generator (19, 62) and connected chemical vapor deposition chamber (28) for providing a vapor for operations such as chemical vapor deposition has an atomizer (16, 16A, 38, 50) for forming an aerosol or droplet spray (36, 58, 74, 80) separate from a vaporization chamber (19, 62). The aerosol is passed into a heated vaporization chamber (19, 62) wherein the particles or droplets are flash vaporized and larger droplets are vaporized by direct contact with heated surfaces. The resulting gas/vapor stream is then used for chemical vapor deposition, in a separate chemical vapor deposition chamber (26). The vapor and gas stream is preferably passed through a restricted passageway (22, 44, 68) for mixing before being introduced into the chemical vapor deposition chamber (26).

10 Claims, 5 Drawing Sheets

METHOD AND APPARATUS FOR VAPOR GENERATION AND FILM DEPOSITION

REFERENCE TO COPENDING APPLICATION

This is a continuation-in-part of our copending application Ser. No. 08/898,662, filed Jul. 22, 1997 now abandoned, which is a continuation of our application Ser. No. 08/867,340, filed Jun. 2, 1997, now abandoned and a continuation-in-part of an application filed under the provisions of the Patent Cooperation Treaty and assigned Ser. No. PCT/US98/11090, having an International filing date of Jun. 1, 1998, under the provisions of 35 U.S.C §365 U.S.C §120 and as to which we are applicants and inventors for the United States.

BACKGROUND OF THE INVENTION

This invention relates to a vaporizer for vapor generation for chemical vapor deposition and related applications using separated chambers for vapor formation and for chemical vapor deposition with flow restriction between the chambers to permit fluid separator for optimum processing.

In chemical vapor deposition, source vapors are commonly used as reagents to react with substrate surfaces to form thin films on the substrate. The main advantage of using source vapors is the ease and precision with which vapor flow rate can be controlled. The main limitation is that not all the reagents can be easily stored in vapor form at ambient temperatures. Some reagents such as BST (barium strontium titanate), SBT (strontium bismuth tantalum), can be much more easily prepared in liquid form at normal temperature with the addition of solvent. Methods of chemical vapor deposition (CVD) that vaporize a liquid source to generate a source gas are therefore preferred for CVD deposition of materials such as BST, SBT, and similar reagents.

One common method used to generate vapor for chemical vapor deposition is to bubble a gas through a heated liquid reagent. As the gas bubbles through the liquid, it is saturated with the reagent vapor. The vapor is then carried by the gas flow to a chamber for deposition. The bubbler generally works well with a pure reagent in liquid form, but is unsuitable for vaporizing materials for BST and SBT deposition. The reagent used for BST and SBT film deposition usually must be dissolved in a solvent and then vaporized. When such a liquid solution is vaporized in a bubbler, the solvent will evaporate more quickly because of its higher volatility. This will cause the concentration of the reagent material in the liquid solution to increase with time. The output vapor quality from the bubbler, therefore, will change with time, causing difficulty in controlling the deposition rate, and the thickness of the film produced. Another disadvantage is the thermal decomposition of the reagents in the bubbler due to the direct contact of the reagent liquid with the heated surface of the bubbler. This premature decomposition may cause variations in the composition in the deposited films and poor reproducibility in film stoichiometry between different CVD deposition runs. Other disadvantages include the large size of the bubbler and a very rapid change in vaporization rate with operating temperature. Very precise temperature control of the bubbler, therefore, is required.

In U.S. Pat. No. 5,278,138 to Ott et al. a multicomponent liquid precursor is first atomized to form an aerosol having droplet diameters primarily in the 0.1 to 10 $\mu$m in diameter range. The aerosol is then mixed with a suitable oxygen-containing carrier gas and injected into a reactor with a heated zone for vaporization and subsequent chemical vapor deposition to produce superconducting thin films, such as yttrium-barium-copper-oxide. Similarly U.S. Pat. No. 5,271,957 to Wernberg et al. describes the formation of $LiNbO_3$ thin films with special electrooptic, ferroelectric and piezoelectric properties by aerosolizing a liquid precursor chemical and introducing the aerosol into a conventional reactor for vaporization and chemical deposition. In both cases, the reactor used is conventional.

In Ott et al. and other prior art, vaporization and deposition is carried out in a single chamber. The addition of a separate heating zone in the reactor allows the liquid source chemical in aerosol form to be vaporized for subsequent deposition on a substrate in the reactor.

To form the vapor, the liquid precursor chemicals are atomized and then vaporized at a temperature high enough for vaporization but not too high, which will cause thermal decomposition of the reagent liquid. However, some thermal decomposition is unavoidable, particularly in practical systems that may have temperature non-uniformity in its heated surfaces. The decomposition products will usually appear in particulate form and be suspended in the gas and vapor mixture. When the mixture gas carrying these particulate contaminants is introduced into the CVD chamber for chemical vapor deposition, the wafer would be contaminated. The film quality would then be poor and the integrated circuit devices incorporating these thin films will then have poor performance characteristics, or become non-functional and need to be discarded.

In addition, to deposit thin form on the wafer by chemical vapor deposition, the CVD chamber must go through a complete cycle of operation. The chamber must first be purged with an inert gas, such as argon or nitrogen. The wafer must then be introduced. The wafer must then be heated to the desired temperature for thin film formation. The gas and vapor mixture from the vaporizer must then be introduced into the CVD chamber and the chamber pressure adjusted to the optimal value for deposition. The condition of the chamber must be maintained for a specific period of time to from a thin film of the desired thickness. The mixture gas flow from the vaporizer into the CVD chamber must then be stopped. The chamber must be purged with an inert gas before another wafer can be introduced for deposition.

The process described above is what is normally used for conventional CVD involving gaseous precursors. Since the precursor chemicals are in gaseous form at room temperature, the various operational steps can be carried out by proper sequencing of solenoid valves, or flow controllers.

In the case of precursor chemicals, which are in liquid form at room temperature, the chemicals can be atomized to form an aerosol and vaporized. However, when the vaporizer is large, and has a large mass, it is impractical to stop the process of vapor generation by turning off the electrical power to the heated surface, and turning it on again when vapor is needed. It is desirable that the vapor be generated continuously, even when it is not needed, and controlling the gas and vapor flow to the CVD chamber by drawing off a portion of the gas and vapor flow as needed. The control of this flow of gas and vapor cannot be the same as those in conventional CVD reactors, since the gas and vapor mixture is at an elevated temperature and cannot be easily controlled.

SUMMARY OF THE INVENTION

The present invention relates to a method and apparatus forming a heated gas vapor mixture and passing it through a conduit to a separate deposition chamber.

One aspect of the invention provides a vaporizer using an aerosol generator that atomizes a liquid into small and larger droplets carried in a gas stream at substantially room temperature. The aerosol in the form of a spray is carried into a heated chamber for vaporization as the gas stream moves across a heated wall of the chamber and is discharged. The aerosol generator breaks the liquid into droplets both large and small, that vaporize. The resultant gas/vapor mixture is the mixture that is introduced into a separate chemical vapor deposition (CVD) chamber. The two chamber approach permits optimizing each chamber for its desired function, because they are sufficiently isolated from each other by the connecting conduit to function independently.

The atomization can be accomplished with reagent liquid at or near normal room temperature so that no thermal degradation of the material will take place during the atomization step. The atomized reagent droplets are mixed with a carrier gas flowing into the atomizer to form an aerosol of suspended reagent droplets. This aerosol is then introduced into a vaporizer having a vaporization chamber where the aerosol (including larger droplets) comes in contact with heated wall surfaces. As heat is transferred from the heated surface to the flowing aerosol stream, the gaseous medium around the suspended reagent droplets becomes heated first. The heated gas in turn heats the suspended aerosol droplets to cause them to vaporize.

Direct physical contact between the liquid reagent and the heated surfaces in the vaporization chamber can thus be greatly reduced or avoided. This leads to greatly reduced thermal decomposition of liquid reagent which is caused by direct contact between the liquid droplets and the heated surface. Larger droplets are vaporized upon contact with the heated walls, but decomposition is minimized. The vaporizer is capable of provided a stable source of vapor, with precisely controllable operating characteristics for chemical vapor deposition of metal, semiconductor or insulating thin films and related applications.

There is little clogging of the vaporizer due to material decomposition by direct contact with a heated surface. Flash vaporizing of the reagent liquid is carried out in a rapid and reproducible manner. The method and apparatus in the preferred form achieves a high vaporization rate, with reduced physical size over existing equipment because the vaporizer can be compact but the interior of the vaporization chamber has a large, effective vaporization surface area. This system also increases the rate of vapor output per unit of carrier gas input, thus increasing the vapor/carrier gas mass ratio. The present invention provides a vaporizer with a rapid time response so that vapor is generated the instant the aerosol is introduced into the heated vaporization chamber. The transfer to the separate CVD chamber can be through an orifice, a capillary tube or other restrictive passageway to obtain turbulent mixing for uniform mixing of the vapor and carrier gas. The capillary tube or orifice can be heated to maintain the vapor temperature and avoid vapor condensation. The flow restriction is sized to permit maintaining a proper pressure differential between the vaporization chamber and the CVD chamber.

Also, in one aspect of the invention the vaporizer is run continuously and any excess gas mixture is withdrawn from the output so the correct flow is provided to the CVD chamber. In addition, a heated porous filter can be provided between the vaporizer and the CVD chamber. The heated porous filter maintains the temperature of the vapor to avoid vapor condensation as the gas/vapor mixture passes through the filter.

DETAILED DESCRIPTION OF THE PREFERRED EMBODIMENTS

Figure 1:
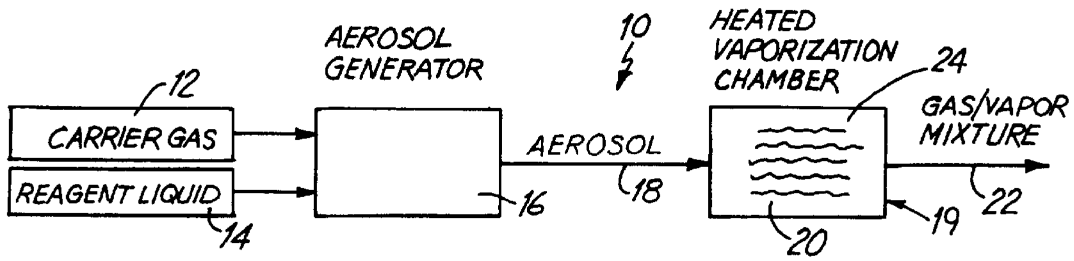
FIG. 1 is a schematic block diagram of a vapor generator made according to the present invention.

FIG. 1 illustrates a vapor generator illustrated generally at 10 which includes a number of components including a carrier gas source 12, and a source of a reagent liquid 14. The carrier gas from source 12 is transferred at high velocity into an aerosol generator or atomizer 16. Reagent liquid from source is introduced into the gas stream or jet in aerosol generator 16. The high velocity gas and reagent liquid provide an output aerosol that moves in a path indicated at 18. The aerosol stream moves into a vaporizer 19 having a heated vaporization chamber 20 that has interior wall surfaces raised to a selected temperature so that it has hot wall surfaces that heat the aerosol stream. The walls are insulated so the exterior remains cool. The gas forming the carrier for the aerosol particles is heated immediately to vaporize droplets in the aerosol. The reagent is vaporized. A gas vapor mixture flows from the vaporizer along a flow path 22.

The aerosol is heated by the hot surfaces of the heated vaporization chamber, which surfaces are heated by heaters represented schematically at 24. Very few aerosol droplets directly contact the interior wall surfaces of vaporization chamber 20, but the droplets are vaporized by heat transfer from the walls to the carrier gas and then to the aerosol particles. The heat transfer through the carrier gas reduces clogging of the vaporizer due to material decomposition. A flash vaporization occurs because of the rapid heating of the carrier gas.

Figure 2:
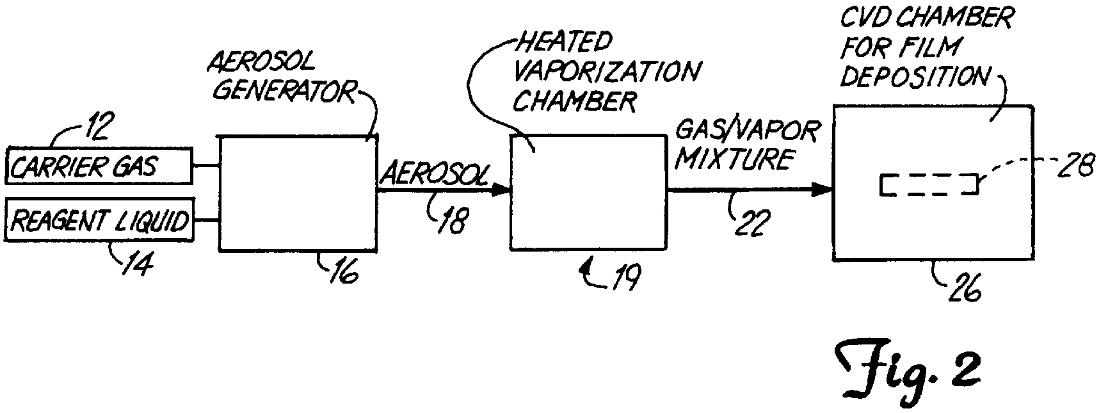
FIG. 2 is a schematic diagram of a vapor generator such as that shown in FIG. 1 used in connection with a chemical vapor deposition chamber for thin film deposition of materials carried in the gas/vapor mixture obtained.

In FIG. 2, the gas/vapor mixture moves along the flow path 22 in the manner previously described in connection with FIG. 1, and is discharged into a film deposition chamber 26 for chemical vapor deposition (CVD), or in other words for depositing a film onto products which are illustrated schematically at 28 supported or suspended within the chamber 26. One key to good chemical vaporization is to have a uniform composition vapor being fed at a uniform rate into the deposition chamber, so that the product will be uniformally coated with the deposited materials. The vaporizer construction thus is of importance to achieve the uniform flow of the vapor, at a relatively high rate for efficiency, while keeping the vaporizer small.

The reagent liquid is formed into an aerosol in the present invention at near normal room temperatures, so that no thermal degradation of the material will take place.

Figure 3:
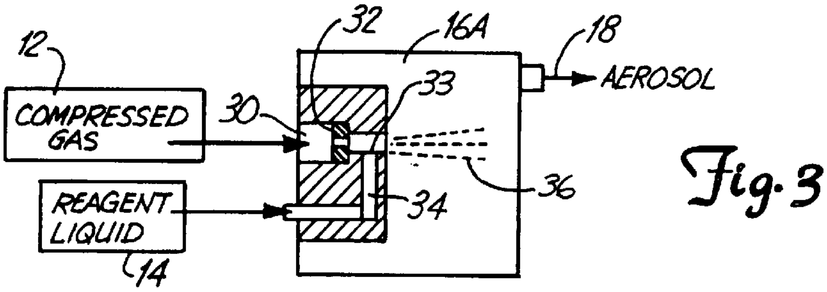
FIG. 3 is a schematic diagram of a compressed gas atomizer or aerosol generator for forming a reagent aerosol for the heated vaporization chamber of FIG. 1, with parts in section and parts broken away.

An atomizer or aerosol generator that will provide a uniform discharge of an aerosol is shown schematically in FIG. 3. The aerosol generator 16A is shown in somewhat different scale. The compressed gas from source 12 enters a passageway 30 having an orifice or nozzle 32 at the inner end. The orifice or nozzle forms a jet of compressed gas passing through the nozzle 32 and into passageway 33 that aspirates reagent liquid from the source 14 through a passageway 34. The reagent liquid enters the passageway 32 and is broken up into droplets to form the high velocity aerosol stream indicated at 36 that will be expelled along the output path 18.

The pressurized carrier gas flows through the orifice or nozzle 32 to form a high velocity gas jet resulting in the atomization of the liquid reagent and forming the aerosol 36. The reagent liquid from source 14 is introduced into the gas jet in chamber 33 and is atomized to form a droplet aerosol that is at the desired gas/vapor mixture ratio. The aerosol is discharged along the flow path 18, and it is then introduced into the heated vaporization chamber 20.

Figure 4:
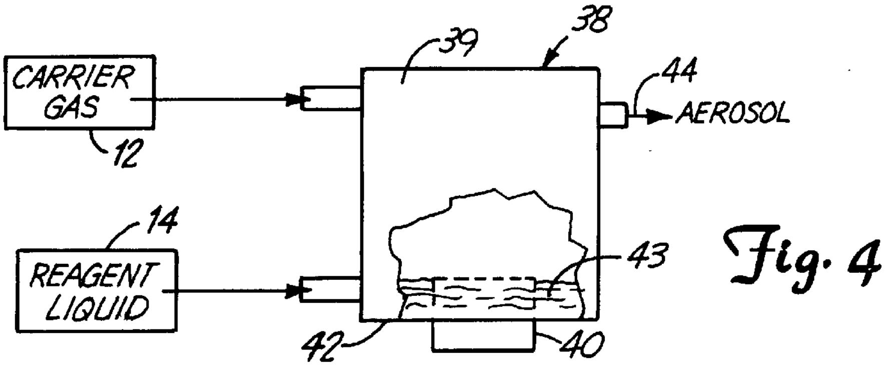
FIG. 4 is a schematic diagram of an ultrasonic atomizer for forming an aerosol for the heated vaporization chamber of FIG. 1.

The carrier gas from source 12 and the reagent liquid from source 14, as shown in FIG. 4 can be introduced into an ultrasonic aerosol generator or atomizer 38 that uses an ultrasonic transducer 40 mounted to a wall 42 of the aerosol generator or atomizer chamber 39. The ultrasonic generator can extend at least partially into or fully into a pool 43 of the reagent liquid that is introduced into the aerosol generator chamber 39. This ultrasonic transducer 40 provides vibrational energy at a high frequency to break up the reagent liquid into droplets capable of being carried by the carrier gas in a gas stream out through a path 44 as an aerosol. The aerosol is provided to the vaporizer 19. Again, the atomization is done at or near room temperature, so the advantages mentioned for the aerosol generator 16 are available using aerosol generator 38.

Figure 5:
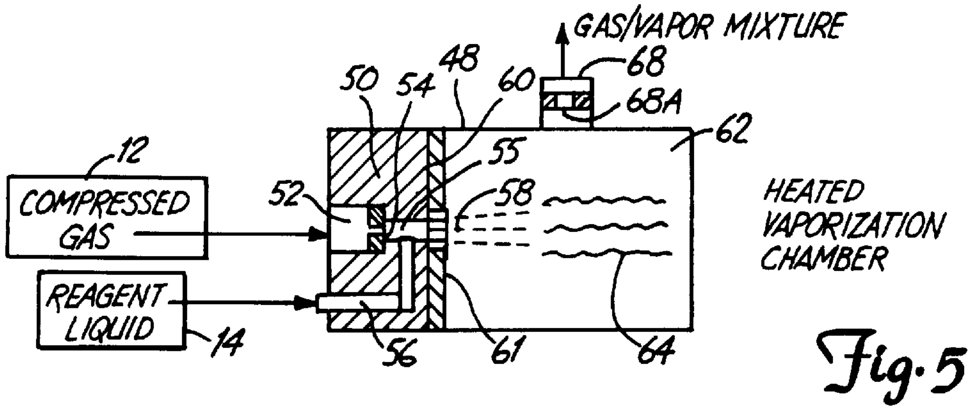
FIG. 5 is a schematic diagram of a compressed gas atomizer combined with a heated vaporization chamber in a single housing for making the design compact and for spraying larger droplets into the vaporization chamber.

In FIG. 5, a combined heated vaporization chamber and atomizer is illustrated. In this form of the invention, a housing 48 has an atomizer section 50 that includes a passageway 52 and an orifice or nozzle 54 that receives compressed gas from the source 12. The gas goes through the orifice or nozzle and forms a jet in a passageway 55. The reagent liquid from the source 14 flows through a passageway 56 into the passageway 55 so that the liquid is broken up into droplets by the high velocity jet of gas. The gas jet is discharged as a droplet spray stream indicated at 58. The high velocity droplet spray passes directly through an insulated divider wall 60 in the housing 48. The housing 48 thus defines an interior vaporization chamber 62 that has suitable heaters 64 along its walls. The heaters will heat the walls to a sufficient temperature to cause vaporization of the droplets as the droplet stream passes the walls and with some direct impingement on the walls. The output from the heated vaporization chamber 62 comes out as a gas/vapor mixture through an outlet tube 68 that is a restricted passageway leading to a separate CVD chamber. As shown, the outlet tube 68 includes an orifice 68A between the chamber 62 and the CVD chamber for providing uniform mixing of the gas/vapor mixture by causing turbulence. The outlet tube 68 can include a capillary or other restrictions for promoting the mixing. The orifice 68A preferably has a diameter less than 0.05 inches. Thus, passageways 22 and 44 can have orifices or may be otherwise restricted, as desired. The wall 60 has an insulation layer 61 to keep the nozzle 54 at or near room temperature.

FIG. 5 shows a compressed gas atomizer spraying liquid reagent droplets directly onto the heated surface in the vaporization chamber opposite from the nozzle. Some of the droplets (usually those larger than about 10 $\mu$m in diameter) may hit the heated surface of the opposite wall and be vaporized on contact. Because of the small droplet size produced by the atomizer section 50, vaporization is nearly instantaneous and complete. Smaller droplets, however, do not have enough forward momentum to collide with the heated surface of the opposite wall. They are heated and vaporized by indirect heating through the intervening carrier gas layer. These small droplets do not come into direct physical contact with the heated surface and thermal decomposition does not occur for such small droplets. Overall, thermal decomposition of the reagent liquid is greatly reduced from conventional units used in vaporizing reagents for chemical vapor deposition. Clogging and crust formation in the vaporizer is greatly reduced, or largely eliminated.

Figure 6:
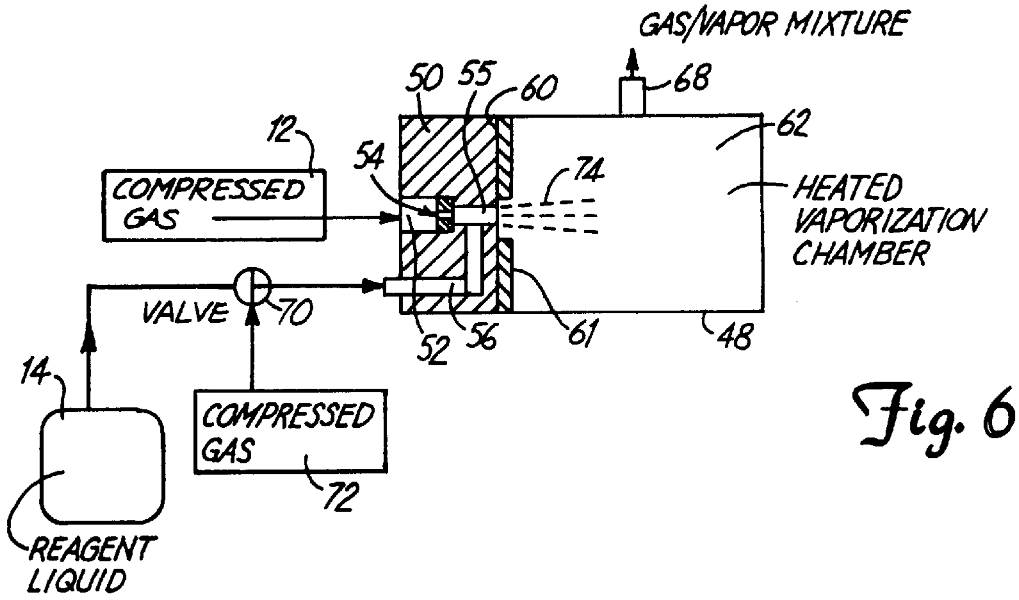
FIG. 6 is a schematic diagram of the device of FIG. 5 showing the use of compressed gas to flush liquids from passageways to avoid drying and plugging.

When vapor generation is stopped by stopping the reagent liquid flow to the vaporizer shown in FIG. 5, the solution remaining in the liquid passageway 56 in the atomizer may evaporate to form a residue. To prevent residue formation in the liquid passageway, compressed gas can be introduced into the atomizer as is shown in FIG. 6, to blow out the liquid in passageways at the end of a cycle of use. This will insure that the small liquid passageway 56 in the atomizer can be kept clean and free of dried out residue that may cause plugging.

After some period of use, some solid residue may build up on the heated surface in the vaporization chamber. It is desirable to have some means of cleaning such surfaces without removing the unit from the CVD system for maintenance.

Figure 7:
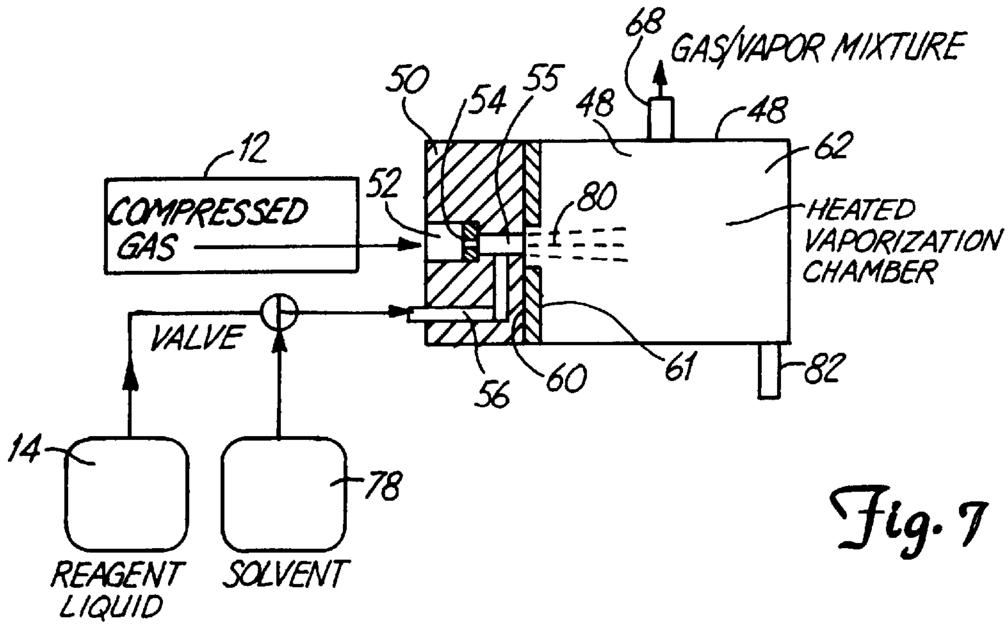
FIG. 7 is a schematic diagram of the device of FIG. 5 showing the use of a solvent to flush and clean the interior of a vaporization chamber with parts in section and parts broken away.

In FIG. 7, the combined housing 48 having both the aerosol generator section and the heated vaporization chamber section has passageway 56 connected to the valve 70, and a solvent source 78 is connected to the valve 70 in place of compressed gas source 72, to permit introducing solvents into the nozzle 54 and passageways in the aerosol generator. Reagent flow from the source 14 is stopped, when the valve 70 is in its position shown in FIG. 7, and the solvent is sprayed under pressure into the heated vaporizer to wash out the build up of residue in the passageways and also in the vaporizer. In other words the solvent will go into the passageway 55 and will be carried in a gas jet 80 into the interior of the chamber section forming the vaporizer to rinse down and clean the wall surfaces. A drain shown at 82 is provided in the housing 48 for draining out the solvent and any residue that the solvent carries with it.

Other atomizers, preferably operating at or near room temperature, to form an aerosol or droplet spray also can be used. The combination of other atomizers providing an aerosol or droplet spray that is introduced into a heated vaporization chamber to produce a hot gas/vapor mixture can be achieved by those skilled in the art. Therefore, such combinations are not specifically described.

In designing compressed gas atomizers for vaporization, it has been found that certain dimensions preferably are maintained to insure proper functioning of the atomizer.

Figure 8:
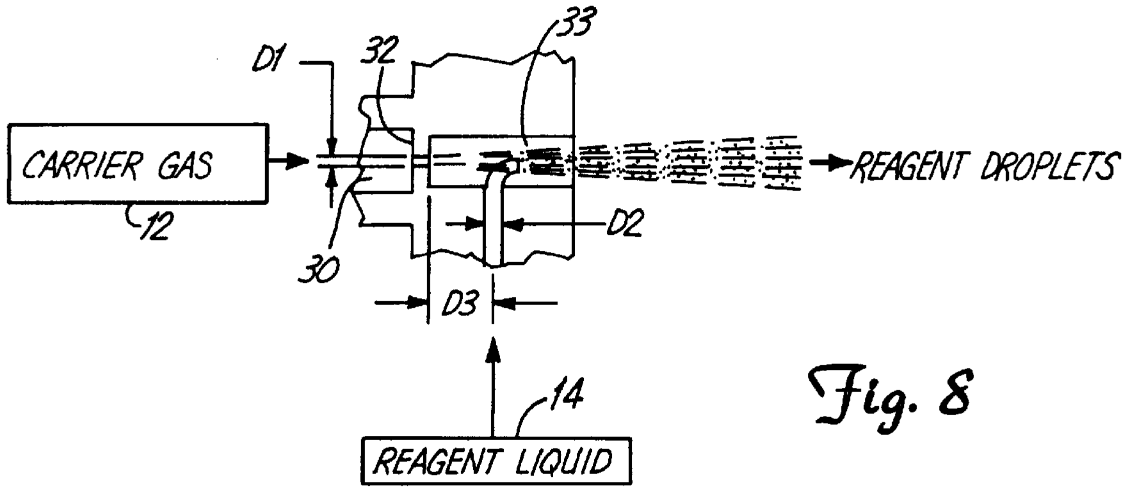
FIG. 8 is a sectional view of an atomizer nozzle used with the present invention for illustrating dimensional relationships for obtaining the desired size reagent droplets.

Referring to FIG. 8, the dimensions D1, D2 and D3 are shown. D1, the diameter of the orifice or nozzle through which the compressed gas flows, is determined by the desired gas flow rate and the compressed gas pressure. D2, the diameter of the liquid flow passageway, is determined by the liquid feed rate and the vapor output rate required. Too small a D2 will result in insufficient liquid flow to the atomizer, and too large a D2 will cause pulsation in the output vapor flow rate. The preferred ratio of D2 to D1 is between 1 and 5. Similarly, D3, the distance between the liquid reagent passageway and the compressed gas orifice used to provide a high velocity jet of gas, should also be maintained between reasonable limits. A small D3 will generally result in small droplet sizes, which are desired for rapid vaporization. But too small a D3 will lead to incomplete atomization of the liquid. However, too large a D3 will result in large atomized droplets, which are undesirable because of the long vaporization time needed for large drops. For desired functioning of the atomizer, the ratio of D3 to D1 is preferably between 1 and 20.

As distinguished from the prior art, in the present invention, the liquid source chemical is atomized to form an aerosol, which is then vaporized in one chamber to produce a vapor/gas mixture. This mixture is then introduced into a separate chamber to carry out chemical vapor deposition (CVD), plasma-enhanced chemical vapor deposition (PECVD), and other film formation steps. This two chamber approach allows for the first chamber to be optimized for vapor generation and the second chamber optimized for chemical vapor deposition. Using two separate chambers, such as the aerosol generator 50 and the vaporization chamber 62, they can operate at one pressure (for instance, atmospheric pressure at 760 Torr) and the CVD chamber 26 at a lower pressure (for instance, a vacuum pressure of 1 Torr). The vapor and carrier gas can be uniformly mixed by turbulent mixing hen the mixture is introduced into the CVD chamber through an orifice such as 68A in FIGS. 5–7, a capillary tube, or other forms of restrictive passageways as the restrictions permit the pressure differential. Uniform mixing of vapor and the carrier gas before introduction into the CVD chamber is important since it allows for the formation of uniform thin films of high quality. This would be impossible with the apparatus of U.S. Pat. Nos. 527,138 and 5,271,957.

The use of an aerosol having small diameter droplets in the 0.1 to 10.0 microns is shown in the prior art. The small droplet diameter limits the liquid to carrier gas ratio that can be achieved. In conventional CVD reactor using gaseous precursors, the mass ratio of the reactant gas (such as silane) to carrier gas (such as nitrogen) is typically a few percent in order to carry out chemical vapor deposition at an acceptable rate for commercial integrated circuit device fabrication. In the case of droplet aerosol that can be produced by conventional atomizers and nebulizers, the precursor droplet mass concentration in the aerosol is typically 1 gram per cubic meter of carrier gas, or a reactant to carrier gas ratio on the order of 0.1%. Such a low reactant to carrier gas ratio, while adequate for making laboratory samples for evaluation, would be inadequate for commercial production purposes.

In the present invention as shown in FIGS. 5–7, an atomizer is used as a sprayer to spray the liquid precursor directly into a heated vaporization chamber. Droplets considerably larger than 10 $\mu$m (for instance, 100 $\mu$m, or even 1000 $\mu$m) in diameter can be sprayed into the chamber for vaporization. This greatly increases the reagent to carrier gas ratio then can be achieved, making if practical to use liquid source chemicals for commercial production purposes. While large droplets may impact on the heated surface and under go some thermal decomposition, the decomposition product will usually remain in the vaporizer and not be carried by the gas flow to cause contamination of the product substrates, which is located in the separate CVD chamber. This effectively isolates the contamination generation process from the film deposition process to enhance the product yield. Using a single reactor for both vaporization and film deposition such as those described by the prior art, the decomposition products generated in the heated zone can easily be re-entrained by the gas flow to contaminate the product substrates located down-stream in the same reactor.

Figure 9:
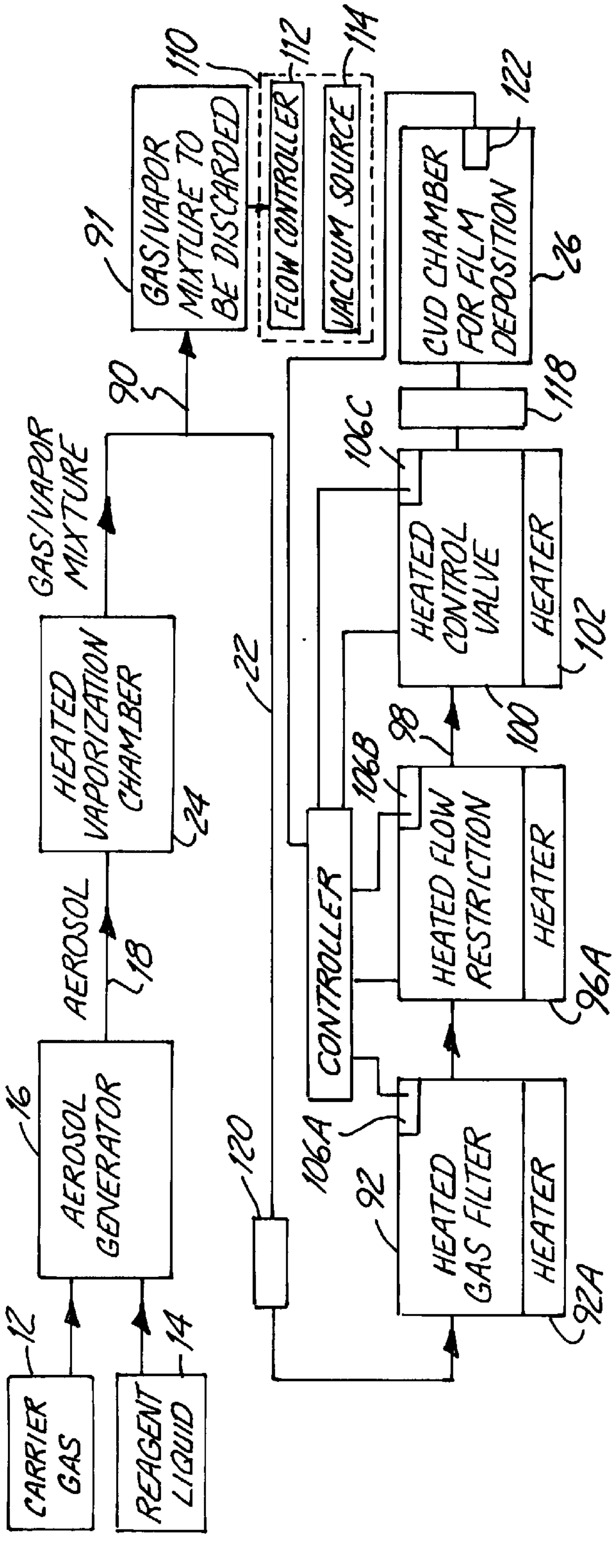
FIG. 9 is a block diagram similar to FIG. 2 showing use of a heated gas filter, heated flow restriction and a heated control valve between the vapor generator and the chemical vapor deposition chamber.

FIG. 9 is a schematic block diagram of a modified form of an aspect of the invention. The carrier gas 12, reagent liquid 14, aerosol generator 16, heater vaporization chamber 24 and the outlet line 22 are all as shown in FIG. 1, and are numbered the same. A bleed line or flow path 90 is connected to line 22 which carries a fluid (gas/vapor mixture) from the heated vaporization chamber 24. If the vaporization chamber 24 is forming or generating a larger volume of gas/vapor mixture (called gas mixture) than that which is used in the CVD chamber 26, some gas mixture will be bled off, rather than shutting off the aerosol generator, as was explained.

The line 22 in this form of the invention, provides a flow of the gas mixture to a heated gas filter 92, which is preferably a porous metal filter or a porous ceramic filter, that has very small flow openings, in the range of 2 microns or less maximum diameter or maximum cross section dimension. The openings through the porous material act as a filter to remove particulate materials. The porous filters are known, commercially, and are porous plates or tubes with a multitude of the small openings or passageways through the plate or tube to provide for adequate filtering, in this case, to remove particulate matter from the gas mixture flow before it is permitted to enter the CVD chamber 26. A heater 92A is represented with the filter. The filter 92 should be heated to a sufficiently high temperature, typically near or at the temperature of the gas and vapor mixture as it leaves vaporization chamber 24, to prevent condensation in the filter. The temperature of the filter 92 must not be so high as to cause thermal decomposition of the vapor molecules, or too low to cause condensation.

The flow passes from filter 92 through a conduit 94 to a heated flow restriction indicated at 96, which could be a heated orifice plate having an orifice that is in the range of 0.05 inches in diameter, and which is heated with a heater 96A to a desired temperature at or near the temperature of the gas/vapor mixture as it exits from the vaporization chamber 24. The flow restriction 96 can be a heated capillary tube that will have a selected length and diameter to restrict the flow into the CVD chamber 26 to permit differentials in pressure to be present in the vaporization chamber and CVD chamber.

The outlet from the flow restriction 96 is along a flow path or conduit 98, and in this form of the invention a heated control valve 100 is used for controlling flow. The heated control valve is adjacent to a heater 102 so that it is maintained at an appropriate temperature. The heaters all can be controlled from a central controller 104 that is sensitive to a feedback temperature signal from sensors 106A, 106B, and 106C adjacent to or in each of the heated components.

As will be shown, the heaters 92A, 96A and 102 can be a single heater in one housing which includes the vaporization chamber, the gas filter, and the flow restriction. The heated control valve can have a separate heater 102, but will have a feedback from a temperature sensor 106C. The heated control valve 100 can be an ordinary gas flow control valve that can be controlled as to its opening size by the controller 104, if desired, or can be merely an on/off valve that will open to provide flow to the CVD chamber 26 or which can be shut off to stop flow to the CVD chamber 26.

The gas vapor mixture to be discarded to maintain the proper flow volume to the CVD chamber is indicated at 91. The discarded flow can be controlled by an optional control assembly 110, which includes an adjustable flow controller 112 that is connected to a vacuum source 114. The vacuum source 114 can be turned on at a suitable time, and the gas mixture withdrawn from the line 22 across the flow path 90 at a desired rate determined by the setting of flow controller 112. The flow controller 112 can be adjusted by the main controller 104 in a known manner to withdraw the volume of gas/vapor mixture that is to be discarded. The discard volume can be determined by back pressure from the flow restriction or by a flow meter 118 that is connected to the input passage to CVD chamber 26. The back pressure sensor 120 can be connected to sense pressure in the line 22. Additionally, the CVD chamber can have a pressure sensor 122 that will provide an output signal indicating the pressure in the CVD chamber. The pressure signals are used by controller 104 for controlling discard gas mixture flow through the flow controller 112 and vacuum source 114 to withdrawn enough gas mixture so that the pressure and flow to the CVD chamber is maintained at a desired level.

Figure 10:
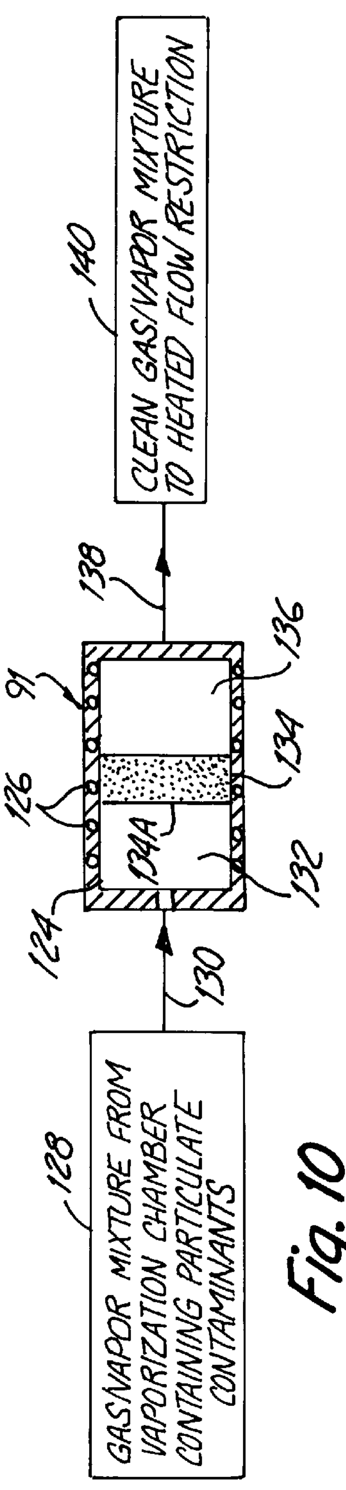
FIG. 10 is a schematic representation of a heated gas filter.

FIG. 10 is a schematic representation of the heated gas filter 91, in a simplified schematic form, which has an outer housing 124 in which heater wires 126 are imbedded, and which will heat the interior chamber of the housing 124. Gas/vapor mixture (also called gas mixture) from the vaporization chamber 24, contains particulate contaminants, as indicated by block 128, and is provided through a flow path or conduit 130 to an inlet of the filter housing 124, and into a primary chamber 132. A block or plate of porous metal or porous ceramic material 134 divides the chamber 132 from an outlet chamber 136, leading to an outlet flow path or conduit 138 connected to the filter housing. The filtered gas/vapor mixture flows to the heated flow restriction 96 as indicated at block 140.

The porous material used for a filter can be a sintered metal, a porous ceramic filter, or other suitable porous material which has pore size less than two microns and most preferably less than 0.5 microns. The number of openings is substantial, so that the pressure drop across the porous material is not significant. The housing 124 and porous plate 134 is maintained at a temperature that is sufficient to prevent condensation of the vapor in the gas mixture being passed through the filter, and yet not high enough to cause material decomposition. The porous material plate 134 and the chambers 132 and 136 are all heated and controlled at a desired temperature by the main controller 104 shown previously. The openings in block 134 are sufficiently small so that particulate contaminants are collected on the input surface 134A of the porous block 134. When the pore openings are less than 2 microns in diameter, and preferably smaller than 0.5 microns, they cause the particulate contaminants to be collected on the surface 134A rather than collected in the interior of the pores or openings in the porous block 134. If the particulate material collects on the interior of the pores there may be clogging of the porous material, so it no longer functions as a filter.

Figure 11:
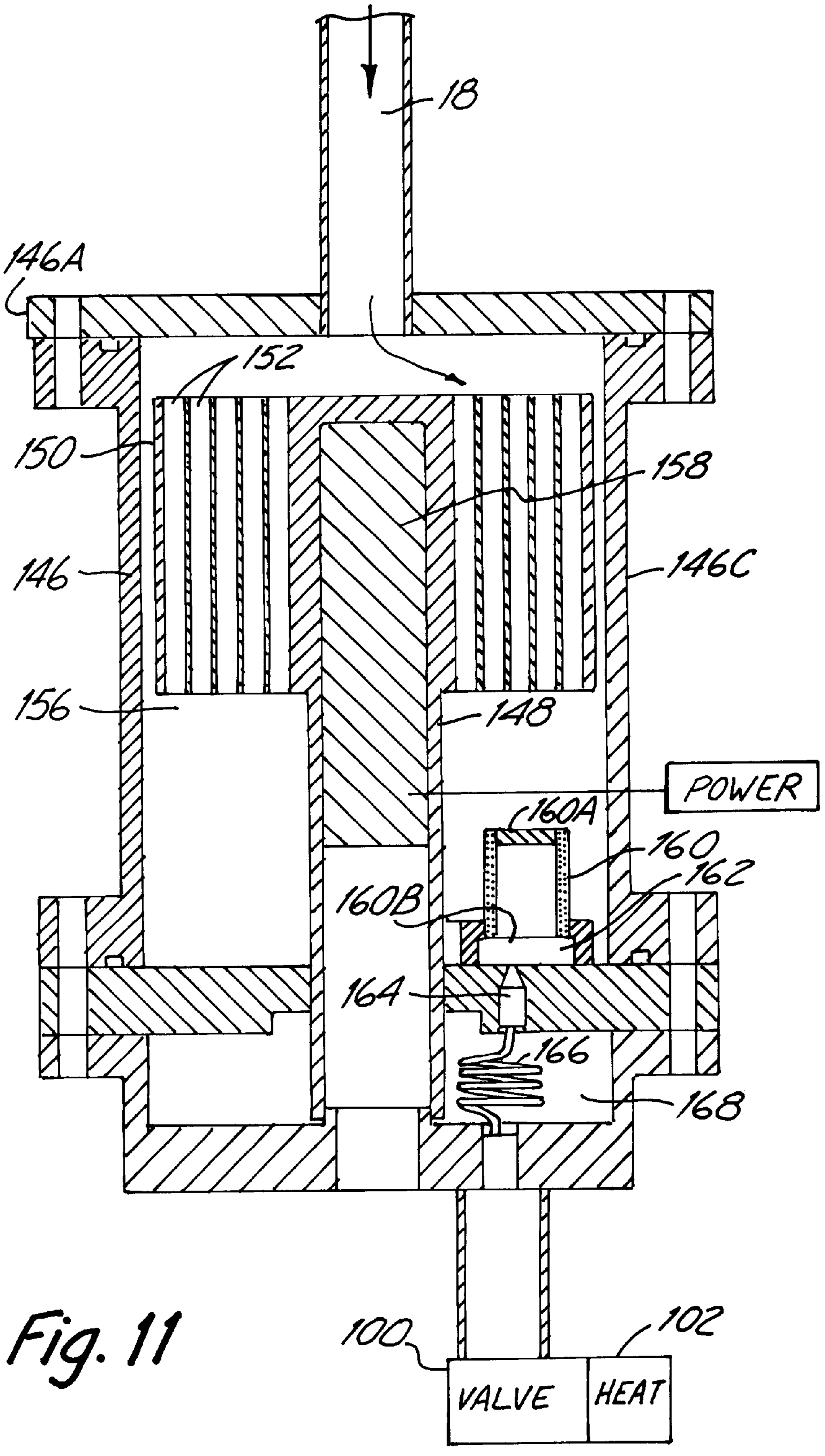
FIG. 11 is a vertical sectional view of a combined vaporization chamber, heated gas filter and flow restrictor.

FIG. 11 is a schematic cross sectional view of a typical housing that combines the vaporization function, the particulate material filter, and the heated flow restriction all in one housing. The heated control valve also can be maintained right at the housing shown if desired.

As schematically shown, an outer housing 146 has end caps 146A and 146B and a central sleeve portion 146C. A central support 148 supports a multiple passage or multiple bore section 150 that has a plurality of bores 152 leading from an inlet chamber 154 to an outlet chamber 156. The flow from the aerosol generator 16 is introduced through the conduit flow passage 18, and passes through the bores 152. The block 150 is heated with an electric heater 158, which can be cartridge type electric heater energized by a suitable power source to provide heat to the block. It can be temperature controlled as discussed previously. The heater 158 also heats the inlet chamber 154 and the outlet chamber 156. Flow passes through one or more tubular porous metal or porous ceramic gas filters 160. The tubular filters have the porous material formed into a tube, have an end block 160A and a center outlet opening 160B which leads into a plenum chamber or manifold 162 that is common to all of the filters 160 provided. The flow of the gas mixture is from the exterior of the tubes of porous material into the interior and out the opening 160B. The filters can be arranged as desired within the housing, and can be circular in cross section. The porous tubes 160 can be made as previously explained in relation to filter 91, such as porous ceramic material or a porous metal, such as a sintered metal.

The manifold or passage 162 has an outlet opening 164 which leads to a capillary tube flow restriction 166. It can be seen that the capillary tube is coiled and within a chamber 168, and thus can be heated from the heater 158, in the chamber 168. The capillary tube comprises flow restriction 96 in FIG. 9. The chamber 168 does not carry flow, but the flow from the manifold 162 only passes through the capillary tube 166 forming the flow restriction device.

The outlet passage then passes from the capillary tube 166 through a heated control valve again labeled 100 as shown in FIG. 9, through a suitable flow passage and then to the CVD chamber 26. Preferably, the capillary tube 166 is selected so that it is smaller than 0.1 inch in internal diameter, and is longer than 1 inch in length. As shown in the drawings, it can be several inches long by coiling it. The selection of a capillary tube is within the skill of the art to provide the necessary flow into the CVD chamber, while creating pressure differential between the heated vaporization chamber 24, which as shown in FIG. 11 can be the chamber in which block 150 is formed, and the CVD chamber 26. This permits separate pressure control in the CVD chamber. Also the amount of gas/vapor mixture provided can be controlled by discarding a selected volume of flow. The operating conditions for the CVD chamber can be optimized.

Although the present invention has been described with reference to preferred embodiments, workers skilled in the art will recognize that changes may be made in form and detail without departing from the spirit and scope of the invention.

What is claimed is:

1. A device to produce a source of a gas stream carrying a vapor of a selected reagent therein comprising an aerosol generator for generating an aerosol in a gas stream, the aerosol generator having a nozzle, a compressed gas source connected to discharge through the nozzle to form the gas stream, a passageway open to the nozzle for a liquid containing the reagent to flow into the passageway to form small droplets containing the selected reagent, a separate vaporization chamber having heated surfaces over which the gas stream passes, the heated surfaces being heated to a temperature to cause vaporization of the droplets carried in the gas stream whereby the gas stream exits the vaporization chamber carrying vapor formed from the droplets, the aerosol generator and the vaporization chamber being mounted in a single housing such that droplets are sprayed directly from the aerosol generator into the vaporization chamber, and an insulated wall between the vaporization chamber and the aerosol generator for reducing heat transfer to the aerosol generator, a separate chemical vapor deposition (CVD) chamber for receiving the gas stream from the vaporization chamber, the separate CVD chamber being connected to the vaporization chamber through a conduit of substantially smaller cross sectional area than the vaporization chamber; and a heated porous gas filter between the vaporization chamber and the separate CVD chamber.

2. The device of claim 1, wherein said aerosol generator is substantially at ambient room temperature.

3. The device of claim 1, wherein the pore openings have cross sectional dimension of not substantially greater than 2 microns.

4. The device of claim 1, wherein the porous gas filter is made of one of a metal and a ceramic material.

5. A device to produce a source of a gas stream carrying a vapor of a selected reagent therein comprising an aerosol generator for generating an aerosol in a gas stream, the aerosol being made up of droplets containing the selected reagent, a separate vaporization chamber having a heated surface which heat an interior volume in the vaporization chamber through which the gas stream passes, the heated interior being heated to a temperature to cause the carrier gas stream to heat the smaller droplets carried in the gas stream to cause vaporization of the droplets carried in the gas stream, whereby the gas stream exits the vaporization chamber carrying vapor formed from the droplets, a separate chemical vapor deposition (CVD) chamber for receiving the carrier gas stream from the vaporization chamber, the separate CVD chamber being connected to the vaporization chamber through a conduit of substantially smaller cross sectional area than the vaporization chamber, the conduit including a heated flow restriction causing a pressure drop of the gas stream between the vaporization chamber and the CVD chamber, the CVD chamber being operated at a lower pressure than the vaporization chamber.

6. The device of claim 5, wherein the flow restriction comprises a capillary tube.

7. A device to produce a source of a gas stream forming a vapor of a selected reagent therein, in combination with a chemical vapor deposition (CVD) chamber, including an aerosol generator for generating an aerosol in a gas stream, the aerosol being made up of droplets containing the selected reagent, a combined vaporization chamber, particulate material filter, and heated flow restriction in a single housing, said housing having a central axis extending from an inlet chamber to an outlet chamber, the inlet chamber being connected to the aerosol generator, a block in the housing between the inlet chamber and outlet chamber, the block having a plurality of axially extending bores therethrough open to the inlet chamber at one end and the outlet chamber at the other end, a heater in the housing for heating said block to vaporize droplets carried in the aerosol to form a heated gas stream carrying vapor formed from the droplets, the particulate material filter comprising a porous filter positioned to filter the gas stream from the outlet chamber as it flows to the CVD chamber, the heated flow restrictor receiving the gas stream from the filter, and positioned in a portion of the housing to be heated by the heater in the housing, the output side of the flow restriction being connected to the CVD chamber, the CVD chamber providing a separate chamber operating at a different pressure than the vaporization chamber because of pressure drop across the flow restriction.

8. The device of claim 7, and a heated valve between the flow restriction and the CVD chamber.

9. The device of claim 7, wherein said filter comprises a porous filter having pore openings with a cross sectional dimension of not substantially greater than two microns.

10. The device of claim 7, wherein the flow restriction comprises a capillary tube that has an internal diameter smaller than 0.1 inch and is longer than 1 inch in length.

* * * * *

UNITED STATES PATENT AND TRADEMARK OFFICE

CERTIFICATE OF CORRECTION

PATENT NO. : 6,409,839 B1
DATED : June 25, 2002
INVENTOR(S) : James J. Sun et al.

It is certified that error appears in the above-identified patent and that said Letters Patent is hereby corrected as shown below:

At the end of Column 12, add the following claims:

11. The device of claim 6, wherein the capillary tube is smaller than 0.1 inch in internal diameter and longer than 1 inch in length.

12. The device of claim 5, wherein the flow restriction comprises an orifice.

13. The device of claim 12, wherein the orifice is smaller than 0.05 inch in internal diameter.

14. The device of claim 5 and a heated valve fluidly connected between the heated flow restriction and the CVD chamber to control the gas flow into the CVD chamber.

15. The device of claim 5 and a valve having an inlet connected to the vaporization chamber, a vacuum source connected to an outlet of the valve, the valve and vacuum source being operable to draw off at least a portion of the gas and vapor mixture flow from the vaporization chamber, to thereby control flow of the gas and vapor mixture through the heated flow restriction into the CVD chamber.

UNITED STATES PATENT AND TRADEMARK OFFICE

CERTIFICATE OF CORRECTION

PATENT NO. : 6,409,839 B1
DATED : June 25, 2002
INVENTOR(S) : James J. Sun et al.

It is certified that error appears in the above-identified patent and that said Letters Patent is hereby corrected as shown below:

16. The device of claim 1 and a heated tube connected between the aerosol generator and the heated vaporization chamber to allow the aerosol generator to be placed at a distance from the vaporization chamber and to minimize aerosol deposition on the tubing walls by the phenomenon of thermophoresis.

Signed and Sealed this

Twenty-first Day of January, 2003

JAMES E. ROGAN
*Director of the United States Patent and Trademark Office*